United States Patent
Yang

(10) Patent No.: US 7,126,211 B2
(45) Date of Patent: Oct. 24, 2006

(54) CIRCUIT CARRIER

(75) Inventor: Chih-An Yang, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/838,433

(22) Filed: May 3, 2004

(65) Prior Publication Data

US 2005/0184371 A1    Aug. 25, 2005

(30) Foreign Application Priority Data

Feb. 25, 2004   (TW)   ............................... 93104722 A

(51) Int. Cl.
   *H01L 21/44*   (2006.01)
   *H01L 23/48*   (2006.01)
(52) U.S. Cl. ...................... 257/678; 257/734; 257/737; 257/738; 257/778; 257/779; 257/795
(58) Field of Classification Search ................ 257/701, 257/778, 779, 780, 789, 787, 707, 840, 841, 257/243
See application file for complete search history.

(56) References Cited

U.S. PATENT DOCUMENTS

| 6,573,610 B1 * | 6/2003 | Tsai ........................... 257/780 |
| 6,673,711 B1 * | 1/2004 | Tong et al. ................. 438/613 |
| 6,678,948 B1 * | 1/2004 | Benzler et al. .............. 29/840 |
| 2003/0127734 A1 * | 7/2003 | Lee et al. .................... 257/737 |

* cited by examiner

*Primary Examiner*—Nathan J. Flynn
*Assistant Examiner*—Fazli Erdem
(74) *Attorney, Agent, or Firm*—J.C. Patents

(57) ABSTRACT

The present invention provides a circuit carrier for connecting to at least a bump. The circuit carrier comprises a substrate, at least a contact pad on a surface of the substrate and a solder mask layer covering the substrate. The solder mask has at least a stepped opening that exposes a portion of the contact pad. The stepped opening includes at least a first opening and a second opening and the size of the first opening is larger than that of the second opening. The stepped opening of the solder mask layer can contain more pre-solder paste, thus increasing the bonding strength between the bump and the contact pad.

7 Claims, 3 Drawing Sheets ial no. 93104722, filed on Feb. 25, 2004.
CIRCUIT CARRIER

CROSS-REFERENCE TO RELATED APPLICATION

This application claims the priority benefit of Taiwan application serial no. 93104722, filed on Feb. 25, 2004.

BACKGROUND OF THE INVENTION

1. Field of Invention

The present invention relates to a circuit carrier. More particularly, the present invention relates to a circuit carrier having a solder mask layer with a stepped opening.

2. Description of Related Art

The flip chip interconnect technology for connecting bare dies (chips) to the carrier substrate can be summarized as follows. A plurality of pads are arranged on the active surface of the chip (die) in arrays and bumps are formed on the pads with the under bump metallurgy layer therebetween. The chip is facedown bonded (flipped) to be contact with the carrier substrate or the printed circuit board (PCB) via solder bumps. Since the flip chip technology has the advantages of achieving the high density of minimizing the package region and shortening the signal transmission path, the flip chip technology has been widely applied to high pin count chip packages.

FIG. 1A is a cross-sectional view illustrating a conventional circuit carrier before connecting the pre-solder paste and the bump. Referring to the FIG. 1, a circuit carrier 100 including a substrate 110, at least a contact pad 120, a solder mask layer 130 and a pre-solder paste 150, is provided. The contact pads 120 are connected to at least a bump 12 on the chip 10. The solder mask layer 130 is formed over the substrate 110. The solder mask layer 130 includes an opening 132. The opening 132 exposes the contact pad 120 and accommodates the pre-solder paste 150. The opening 132 has a size D1.

FIG. 1B is a schematic cross-sectional view illustrating a conventional circuit carrier after connecting the pre-solder paste and the bump. After the chip 10 is arranged onto the carrier 100, a reflow process is performed and the pre-solder paste 150 is melted during the reflow process. Thus, bumps 12 are attached to the contact pads 120.

The connection strength between the bump and the contact pad is critical for the reliability of the package structure and the yield of assembly. Since the volume of the solder paste is closely related to the connection strength, it is desirable to enlarge the opening of the solder mask layer for more solder paste. However, larger the opening becomes, larger the contact pad becomes. Since larger contact pads will occupy more area, the wire density or trace routing density of the substrate has to be reduced.

In fact, as the integration of the package assembly keeps increasing and the bump pitch keeps decreasing, the corresponding contact pads and openings of the solder mask layer need to be smaller. For those smaller contact pads, the current density is increased and electro-migration (EM) is increased. With elevated electro-migration, tin in the bumps easily reacts with copper in the contact pads to produce inter-metallic compounds in the interface. Because these inter-metallic compounds are fragile, the connection strength between the bumps and the contact pads is greatly deteriorated, which often leads to disconnection. Furthermore, electro-migration can even result in shorts.

SUMMARY OF THE INVENTION

The present invention provides a circuit carrier, applied in the package structure, which enhance the connection strength between the bump of the chip and the contact pad of the carrier by providing more pre-solder paste.

The present invention provides a circuit carrier applicable for connecting at least a bump, the circuit carrier comprising a substrate, at least a contact pad and a solder mask layer over the substrate. The solder mask layer includes at least a stepped opening that exposes a portion of the contact pad. The stepped opening includes at least a first opening and a second opening, while a size of the first opening is larger than that of the second opening.

As embodied and broadly described herein, due to the stepped opening of the solder mask layer for accommodating more pre-solder paste, the structure of the present invention affords better connection strength between the bump and the contact pad. Moreover, an electro-migration resistive layer can be further included between the contact pad and the pre-solder paste, for increasing the electro-migration resistance. Hence, less inter-metallic compounds are generated in the interface and the connection strength can be maintained over a longer period, thus increasing the reliability and quality of the package structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
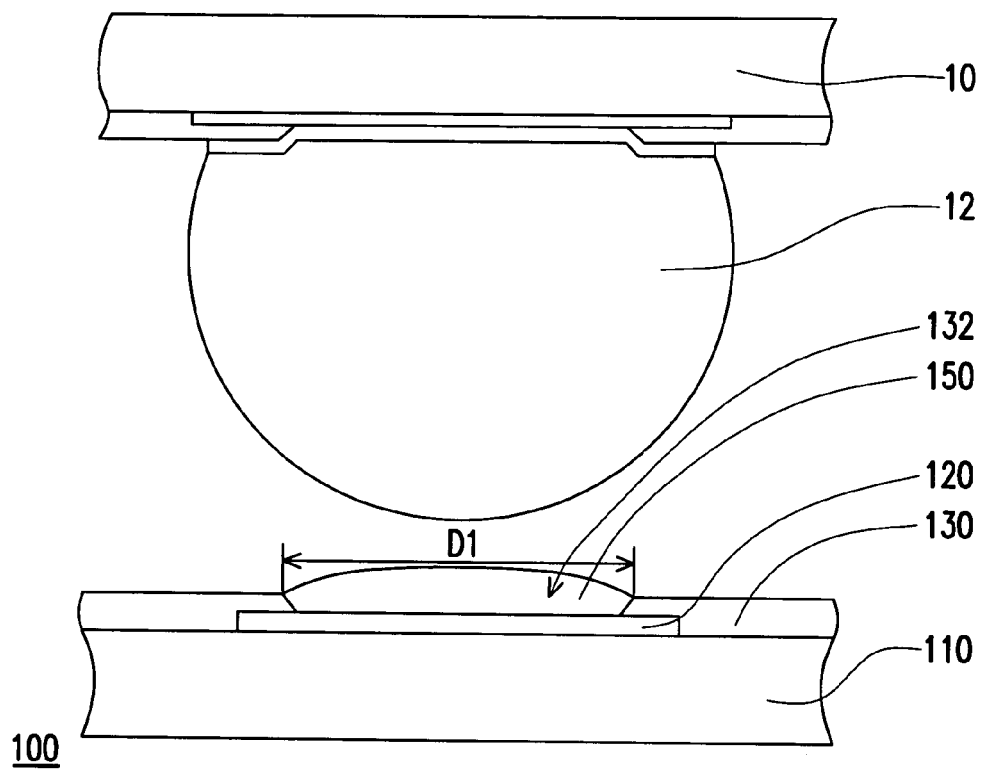
FIGS. 1A–1B are cross-sectional views illustrating a conventional circuit carrier.
Figure 1B:
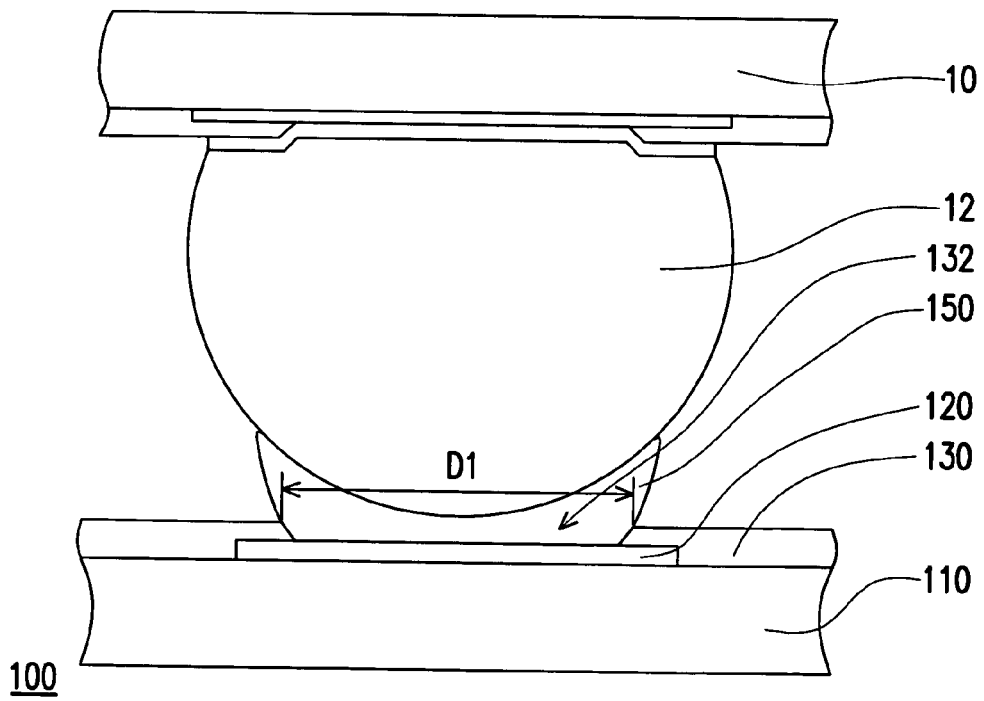
Figure 2A:
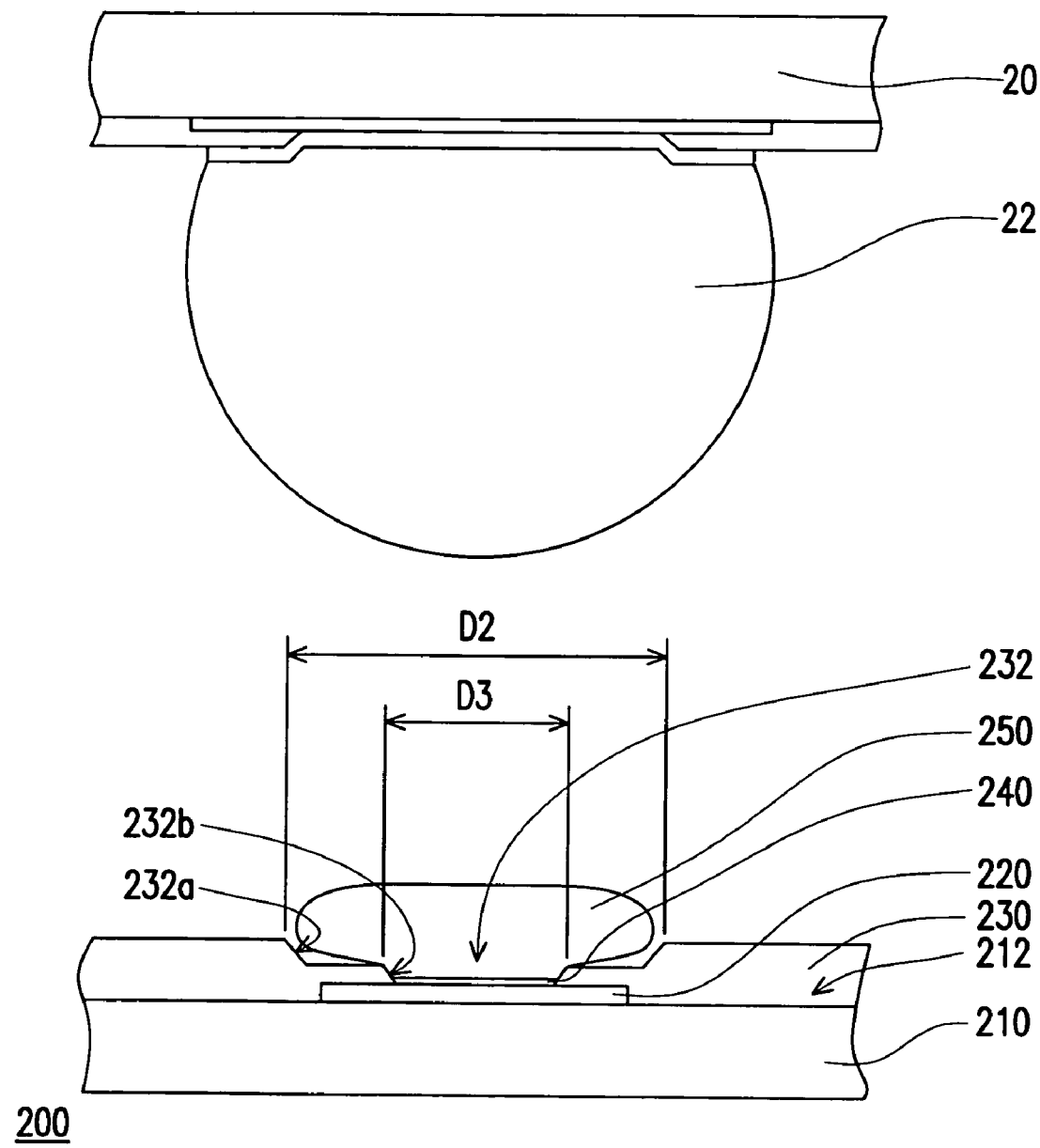
FIGS. 2A–2B are schematic cross-sectional views illustrating a circuit carrier according to one preferred embodiment of this invention.

FIG. 2A is a schematic cross-sectional view illustrating a circuit carrier before connecting the pre-solder paste and the bump. The circuit carrier 200 includes at least a substrate 210, a plurality of contact pads 220 (only one is shown), a solder mask layer 230, a passivation layer 240 and a pre-solder paste 250. The substrate 200, for example, a laminated substrate, includes a plurality of conductive layers, a plurality of insulation layers disposed alternatively between two adjacent conductive layers and a plurality of through-holes, whereas each through-hole at least penetrates one insulation layer for connecting two conductive layers. The contact pads 220, disposed on a surface 212 of the substrate 210, are connected to a plurality of bumps 22 on the chip 20. The bumps 22 are solder bumps for flip chip connection, for example. The topmost (outermost) conductive layer of the substrate 210 may constitute the contact pads 220. In that case, since the conductive layer of the substrate 210 is usually made of copper, the material of the contact pad 220 is copper. For preventing the surface of the contact pad 220 from oxidation, a protection layer 240, for example, a nickel/gold layer, can be formed on the exposed surface of the contact pad 220.

Referring to FIG. 2A, a solder mask layer 230 is blanketly formed to cover the surface 212 of the substrate 210. The solder mask layer 230 includes a plurality of stepped openings 232 (only one is shown). The opening 232 exposes a portion of the contact pad 220. Namely, the contact pad 220 is a solder-mask-define (SMD) type contact pad. Each of the openings 232 in the solder mask layer 230 receives one block of pre-solder paste 250. The pre-solder paste can be formed by, for example, implanting globular globes within the openings of the solder mask layer. Not only the solder mask layer 230 covering the surface of the substrate 210 can protect the patterned conductive layer of the substrate 210, the solder mask layer 230 but also can limit the flow of the pre-solder paste 250 during the reflow step. Therefore, the adjacent pre-solder pastes will not be welded together and shorted during the reflow process.

Figure 2B:
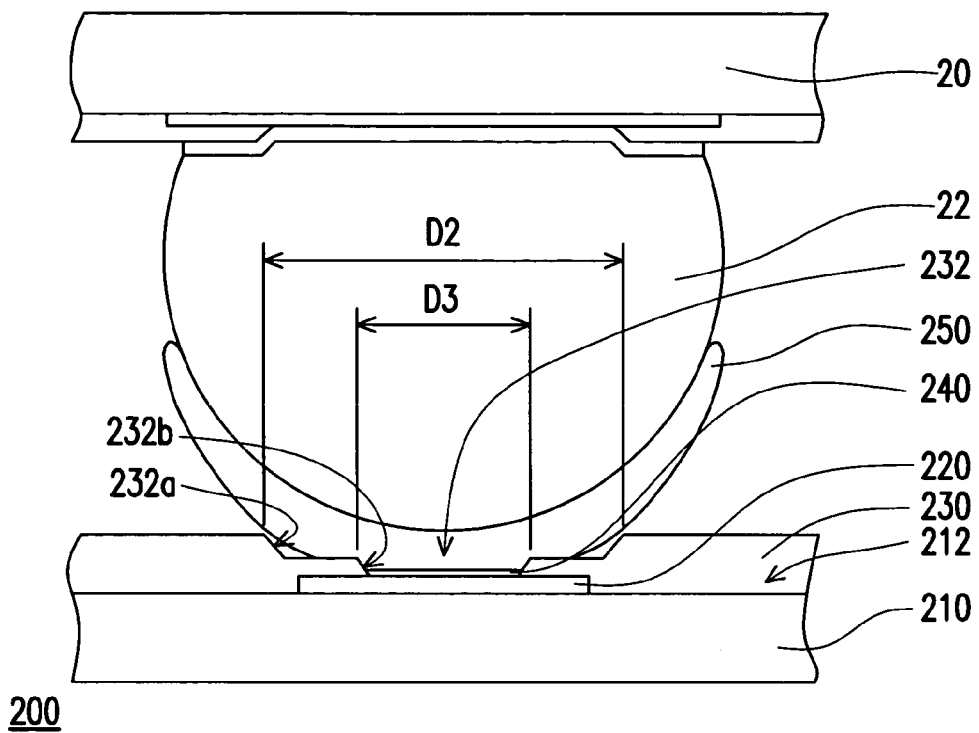

FIG. 2B is a schematic cross-sectional view illustrating a circuit carrier after connecting the pre-solder paste and the bump. Usually, the material of the pre-solder paste 250 is a tin/lead (Sn/Pb) alloy, and material of the bump 22 is a tin/lead (Sn/Pb) alloy. For the pre-solder paste 250, the Sn/Pb ratio is about 63/37, for example. For the bump 22, the Sn/Pb ratio is about 5/95 or 3/97, for example. The melting point of the pre-solder paste 250 is often lower than that of the bump 22. After the chip 20 is arranged onto the carrier 200 and the bump 22 contacts with the pre-solder paste 250, a reflow process is performed. The pre-solder paste 250 is melted during the reflow process and the melted pre-solder paste 250 wraps around the bottom and the lower part of the bump 22. Thus, bumps 22 are firmly attached and connected to the contact pads 220 and the chip 20 is electrically connected to the carrier 200. Optionally, an underfill material (not shown) is filled between the chip 20 and the carrier 200.

Referring back to FIG. 2A, in order to accommodate more pre-solder paste, the opening 232 in the solder mask layer 230 is in a terrace shape, for example, including more than one step in the cross-sectional view. For instance, the opening in a terrace shape with two steps in the cross-sectional view (T-shaped) is similar to a dual damascene opening in the cross-sectional view. The stepped opening 232 has a first opening 232a and a second opening 232b. The second opening 232b is closer to the contact pad 220, while the first opening 232a is farther from the contact pad 220. The size D2 of the first opening 232a is larger than the size D3 of the second opening 232b.

Taking a two-step stepped opening as an example, the solder mask layer 230 with the stepped openings 232 may be formed by forming a second solder mask layer 230b with the second openings 232b and a first solder mask layer 230a with the first openings 232a sequentially by, for example, printing, while the contact pads 220 are exposed by the openings 232a/b.

When comparing with the conventional structure, if the opening size D2 of the stepped opening is about the same as the opening size of the conventional structure, the solder mask layer 230 of this invention can accommodate more pre-solder paste 250 due to the stepped openings. Therefore, the connection strength between the bump 22 and the contact pad 220 is enhanced. Nonetheless, for the same amount of paste received in the opening, the opening size D2 or D3 of the stepped opening can be smaller than that of the conventional structure and a smaller contact pad is needed for a SMD type contact pad. It is beneficial for fine pitch trace routing. Since the contact pads are smaller, the distance between adjacent contact pads becomes larger and more traces can be arranged in-between, thus increasing the pitch for trace routing. Further, due to the shrinkage of the contact pads, more contact pads can be arranged for the connection with the bumps.

Figure 3:
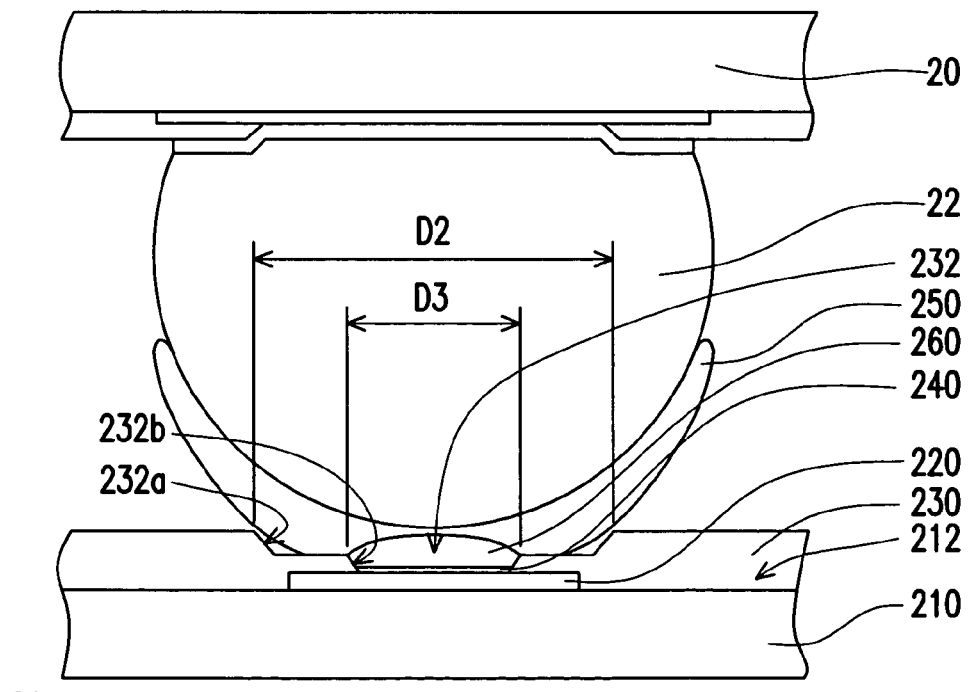
FIG. 3 is a schematic cross-sectional view illustrating a circuit carrier according to another preferred embodiment of this invention.

Alternatively, an electro-migration (EM) resistive layer 260 may further be included between the pre-solder paste 250 and the contact pad 220, as shown in FIG. 3. The EM resistive layer 260 provides high electro-migration resistance and the material of the EM resistive layer 260 can be lead free solder or other solder material with high melting points. Preferably, the melting point of the EM resistive layer 260 is higher than that of the pre-solder paste 250. For high power/current devices (such as, CPU or GPU), as the bumps are constantly under high temperature and high current density, electro-migration is augmented and tin in the bumps easily reacts with copper in the contact pads to produce inter-metallic compounds in the interface, thus deteriorating the connection strength between the bumps and the contact pads and inducing disconnection between them. Hence, in order to maintain the connection strength and enhance the connection reliability, the EM resistive layer 260 of high EM resistance is provided between the pre-solder paste 250 and the contact pad 220. Especially for the contact pads of smaller sizes, higher electro-migration resulted from the smaller sizes can be compensated by the EM resistive layer provided between the pre-solder paste and the contact pads.

Accordingly, the present invention provides at least an assembly structure comprising a substrate 210, at least a contact pad 220, a solder mask layer 230 and a pre-solder paste 250. Moreover, the present invention also provides at least a package structure comprising a chip 20, at least a bump 22, a substrate 200, at least a contact pad 220, a solder mask layer 230 and a pre-solder paste 250.

In the present invention, the stepped openings of the solder mask layer can accommodate more pre-solder paste for increasing the connection strength between the bumps and the contact pads. Moreover, due to the stepped openings of the solder mask layer, smaller contact pads are needed for SMD type contact pads and higher trace routing pitch can be provided. The package structure of this invention can further include a EM resistive layer between the pre-solder paste and the contact pad, for enhancing the connection reliability between the bump and the contact pad for a longer period by reducing the growth of inter-metallic compounds.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit carrier, applied for connecting to at least a bump of a chip, comprising:
   a substrate having a surface;
   at least a contact pad disposed on the surface of the substrate, for connection with the bump;
   a solder mask layer covering the surface of the substrate and having at least a stepped opening formed above the contact pad, wherein the stepped opening exposes a portion of the contact pad and the stepped opening includes a first opening and a second opening, wherein the second opening is closer to the contact pad, while the first opening is farther from the contact pad, and a size of the first opening is larger than that of the second opening;

a pre-solder paste disposed on the exposed portion of the contact pad and in the stepped opening of the solder mask layer, wherein the contact pad is connected to the bump through the pre-solder paste; and an electro-migration resistive layer disposed between the pre-solder paste and the exposed portion of the contact pad for increasing electro-migration resistance.

2. The circuit carrier of claim 1, wherein a material of the contact pad includes copper, and a material of the bump includes tin.

3. The circuit carrier of claim 1, wherein a melting point of electro-migration resistive layer is higher than that of the pre-solder paste.

4. A package structure, comprising:
a chip;
at least a bump disposed on the chip;
a substrate having a surface;
at least a contact pad disposed on the surface of the substrate, for connection with the bump;
a solder mask layer covering the surface of the substrate and having at least a stepped opening formed above the contact pad, wherein the stepped opening exposes a portion of the contact pad and the stepped opening includes a first opening and a second opening, wherein the second opening is closer to the contact pad, while the first opening is farther from the contact pad, and a size of the first opening is larger than that of the second opening;

a pre-solder paste disposed on the exposed portion of the contact pad and in the stepped opening of the solder mask layer, wherein the contact pad is connected to the bump through the pre-solder paste; and an electro-migration resistive layer disposed between the pre-solder paste and the exposed portion of the contact pad for increasing electro-migration resistance.

5. The structure of claim 4, wherein a material of the contact pad includes copper, and a material of the bump includes tin.

6. The structure of claim 4, wherein a melting point of electro-migration resistive layer is higher than that of the pre-solder paste.

7. The structure of claim 4, wherein a melting point of the pre-solder paste is lower than that of the bump.

* * * * *